United States Patent
Ohishi et al.

(10) Patent No.: US 7,410,818 B2
(45) Date of Patent: Aug. 12, 2008

(54) THIN FILM TRANSISTOR, LIQUID CRYSTAL DISPLAY USING THIN FILM TRANSISTOR, AND METHOD OF MANUFACTURING THIN FILM TRANSISTOR

(75) Inventors: Mitsuma Ohishi, Kanagawa (JP); Satoshi Kimura, Akita (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 78 days.

(21) Appl. No.: 11/603,127

(22) Filed: Nov. 22, 2006

(65) Prior Publication Data

US 2007/0063283 A1   Mar. 22, 2007

Related U.S. Application Data

(62) Division of application No. 11/052,224, filed on Feb. 8, 2005, now Pat. No. 7,161,212.

(30) Foreign Application Priority Data

Feb. 10, 2004   (JP) .............................. 2004-34094

(51) Int. Cl.
*H01L 21/336* (2006.01)
(52) U.S. Cl. .................. 438/30; 438/163; 438/719; 257/E33.001; 257/E21.411

(58) Field of Classification Search .................. 438/30, 438/158, 163, 719; 257/E33.001, E21.411
See application file for complete search history.

(56) References Cited

U.S. PATENT DOCUMENTS

| 5,213,990 A | 5/1993 | Rodder |
| 2004/0196416 A1 | 10/2004 | Cho et al. |
| 2005/0051780 A1 | 3/2005 | Ando et al. |

FOREIGN PATENT DOCUMENTS

| JP | 11-26768 | 1/1999 |
| JP | 2000-164886 | 6/2000 |
| JP | 2001-242490 | 9/2001 |
| JP | 2001-324725 | 11/2001 |
| JP | 2002-55364 | 2/2002 |
| JP | 2002-57338 | 2/2002 |
| JP | 2005-72135 | 3/2005 |

OTHER PUBLICATIONS

Japanese Office Action dated Sep. 18, 2007 with Partial English Translation.

*Primary Examiner*—George Fourson
(74) *Attorney, Agent, or Firm*—McGinn IP Law Group, PLLC (57) ABSTRACT

A semiconductor film, which is located over a gate electrode for forming a channel region between a source electrode and a drain electrode, has a width greater than a width of the source electrode and a width of the drain electrode located over the gate electrode. Irregularities are formed in a width direction of the semiconductor film on both edge portions in the channel region.

9 Claims, 8 Drawing Sheets

PRIOR ART

PRIOR ART

THIN FILM TRANSISTOR, LIQUID CRYSTAL DISPLAY USING THIN FILM TRANSISTOR, AND METHOD OF MANUFACTURING THIN FILM TRANSISTOR

The present Application is a Divisional Application of U.S. patent application Ser. No. 11/052,224, filed on Feb. 8, 2005 now U.S. Pat. No. 7,161,212.

BACKGROUND OF THE INVENTION

1. Field of the Invention

The present invention relates to a thin film transistor, a liquid crystal display using this thin film transistor, and a method of manufacturing the thin film transistor. More specifically, the present invention relates to a thin film transistor with improved on-current and channel length, a liquid crystal display using this thin film transistor, and a method of manufacturing this thin film transistor.

2. Description of the Related Art

Liquid crystal displays using thin film transistors (TFTs) as switching elements have widely spread. An inverted staggered structure is adopted in many amorphous silicon (a-Si) TFTs. While TFTs are classified into a channel protection type or a channel etch type, the channel etch type is the mainstream today in order to reduce the number of manufacturing steps.

Although a method of manufacturing a channel etch type TFT realizable by using five or six masks has been conventionally applied, a method of manufacturing a channel etch type TFT realizable by using four masks has been disclosed in order to further reduce the number of manufacturing steps.

For example, according to Japanese Laid-open Patent No. 2000-164886, the number of manufacturing steps is reduced by using a photosensitive film, which is formed thinly at a channel region of a TFT and formed thickly in source and drain electrode formation regions, while removing the photosensitive film in other regions, so as to isolate source and drain electrodes made of the same metal layer. Firstly, a conductive layer is formed on an insulating substrate, and the conductive layer is patterned to form a gate wiring by use of a first photomask while applying the photo-lithographic technique and the etching technique. A gate insulating film is formed on the gate wiring and a semiconductor layer, an n$^+$ doped semiconductor layer, and source and drain metal layers are laminated. Subsequently, a photosensitive film is formed thickly on a source electrode formation region and on a drain electrode formation region and is formed thinly on a region between the source and the drain electrode formation regions by use of a second photomask and the photo-lithographic technique. Further, the source and drain metal layers, the n$^+$ doped semiconductor layer, and the semiconductor layer are etched by using this photosensitive film as a mask to pattern the source and drain electrodes, the n$^+$ doped semiconductor layer, and the semiconductor layer. At the same time as the etching of the n$^+$ doped semiconductor layer and the semiconductor layer, the thickness of the photosensitive film is reduced by removing controlled amount of the thin photosensitive layer in the region between the source and the drain electrode formation regions.

The photosensitive film on the source and drain electrode formation regions is reduced in the thickness but still remains thereon. By etching the source and drain metal layers exposed between the source and drain electrode formation regions and further etching the n$^+$ doped semiconductor layer between the source and drain electrode formation regions, the source and drain electrodes as well as the n$^+$ doped semiconductor layer are patterned. Then, the photosensitive film is removed.

Next, a passivation layer is formed and then a contact hole is formed by use of a third photomask while applying the photo-lithographic technique and the etching technique. Subsequently, a transparent conductive film is formed and a pixel electrode is formed by use of a fourth photomask while applying the photo-lithographic technique and the etching technique.

Above mentioned photosensitive film will be described at photo-resist, hereafter.

Figure 1A:
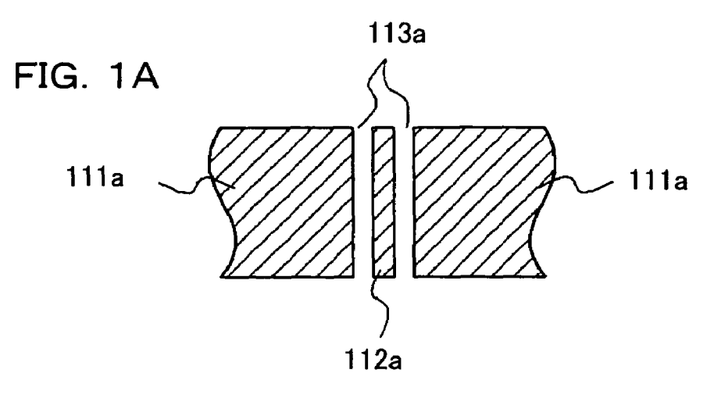
FIG. 1A to FIG. 1C are plan views showing photomask patterns of prior art.
Figure 1B:
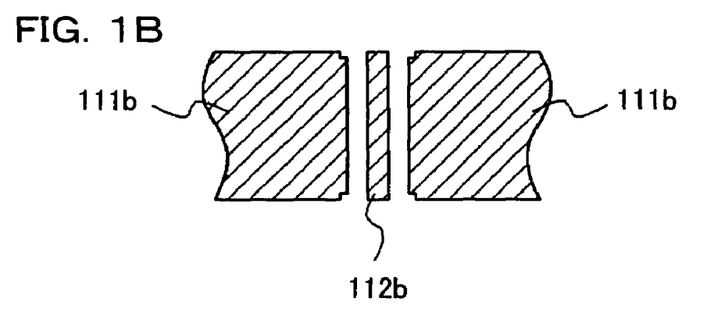

Meanwhile, Japanese Laid-open Patent No. 2001-324725 discloses a photomask pattern, which is configured to form a photo-resist pattern thickly at source and drain electrode formation regions and to form the photo-resist pattern thinly at a region between the source and drain electrode formation regions. As shown in FIG. 1A, this photomask pattern includes two light shielding regions 111$a$ for covering to form source and drain electrodes, and an narrow rectangular light shielding portion 112$a$ disposed between the two light shielding regions 111$a$ while respectively interposing slits 113$a$. Exposure is performed by use of the above-described photomask pattern. Based on the understanding that there arises a problem that there becomes non uniform in thickness a thin photo-resist pattern in a channel region between the source and drain electrode formation regions when using the above-described mask pattern, there is also disclosed a photomask pattern includes light shielding regions 111$b$ having cut-off corners on both ends as shown in FIG. 1B, for example. A photo-resist pattern is formed by use of the above-described photomask pattern, and then a metal layer, an n$^+$ a-Si layer, and an a-Si layer are etched to pattern source and drain electrodes, the a-Si layer, and the n$^+$ a-Si layer. Thereafter, a thin portion of the photo-resist pattern between the source and drain electrode formation regions is removed. Further, the n$^+$ a-Si layer and the a-Si layer are etched by using the separated photo-resist pattern as a mask.

Figure 2A:
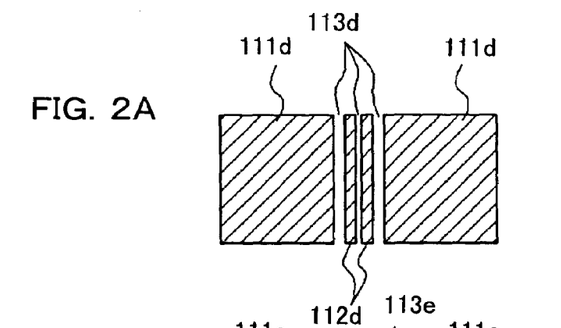
FIG. 2A and FIG. 2B are plan views showing photomask patterns of prior art.

Meanwhile, Japanese Laid-open Patent No. 2002-55364 also discloses photomask patterns in various shapes. For example, as shown in FIG. 2A, there is disclosed a photomask pattern including a plurality of narrow rectangular light shielding portions 112$d$ arranged while interposing slits 113$d$ between two light shielding regions 111$d$. When a thin film transistor is manufactured by use of this photomask pattern, a semiconductor film 104 above a gate electrode 102 and between a source electrode 106$a$ and a drain electrode 106$b$, i.e. each endportion of a channel region in the semiconductor film 104, is formed in a bent manner due to a light interference phenomenon, as shown in FIG. 2C. In this specification, such end portions of a channel region of a TFT will be here in after referred to as both edge portions. When bending occurs in both edge portions of this semiconductor film 104, a path of an on-current of the TFT is also flexed. Accordingly, image quality of a liquid crystal display formed by arranging such TFTs in a matrix will be degraded. To prevent occurrence of the flexure on the both edge portions, there is also disclosed a technique to form a wide semiconductor film 104 as shown in FIG. 2D by use of a photomask pattern in the shape as shown in FIG. 2B, for example.

Figure 1C:
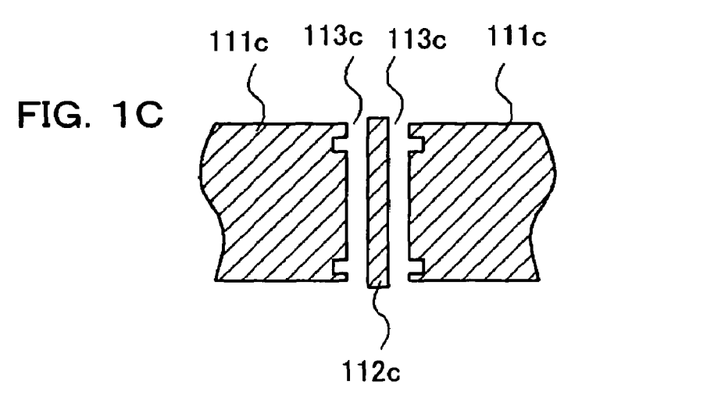

Moreover, Japanese Laid-open Patent No. 2002-57338 discloses that uniformity of the thickness of the thin photo-resist pattern for forming the channel region between the source and drain electrode formation regions is degraded by use of the above-described photomask pattern shown in FIG. 1A. In addition, this gazette also discloses problems that unevenness in the channel length among the TFTs is increased when using the photomask pattern as shown in FIG. 1A due to nonuniformity of the film thickness of the photo-resist pattern, and that display characteristic of a liquid crystal display is degraded as a consequence. To solve these problems, there is disclosed an improvement in the shape of light shielding regions 111c of the photomask pattern as shown in FIG. 1C.

Incidentally, each of these photomask patterns includes a light transparent portion, the light shielding region, and a semi-transparent region which is made up of a light transparent and light shielding pattern below resolution ability of an exposure apparatus. Light transmission amount of this semi-transparent region is susceptible to unevenness of the photomask pattern caused in manufacturing. For example, in the photomask pattern shown in FIG. 1B, each endportion of an aperture slit is formed wider than the center portion of the aperture slit, while width of a semi-transparent region is selected equal to or narrower than the resolution ability of the exposure apparatus. In particular, the influence of unevenness of the photomask pattern caused in manufacturing is more significant at the end portion as compared to the center of the aperture slit. Accordingly, the light transmission amount in the semi-transparent region is different between the center and the end portion of the aperture slit. Therefore, there is a problem that the thickness of the photo-resist pattern formed in the semi-transparent region becomes non uniform.

Figure 2B:
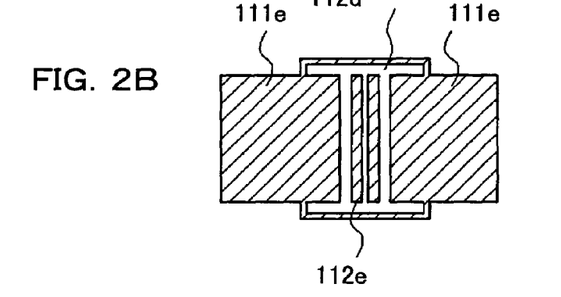
Figure 2C:
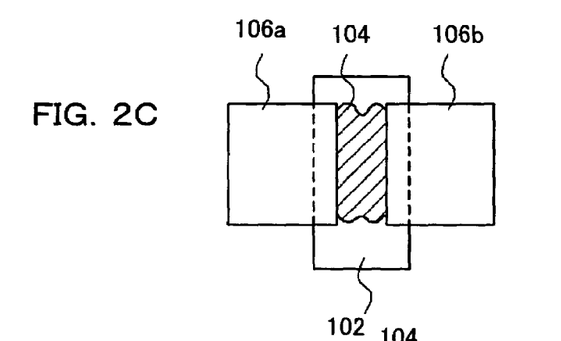
FIG. 2C and FIG. 2D are plan views showing thin film transistors manufactured by use of the photomask patterns shown in FIG. 2A and FIG. 2B.
Figure 2D:
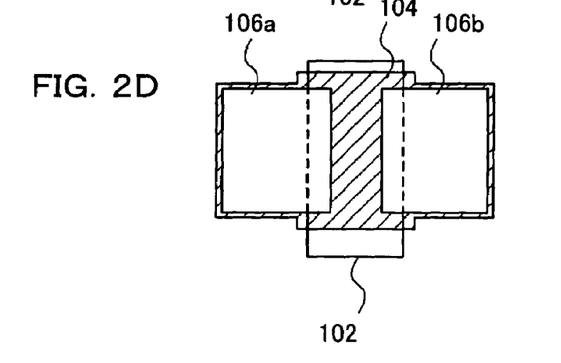

Meanwhile, in the photomask pattern shown in FIG. 2B, the semi-transparent portion inside the channel region includes the aperture slits and the light shielding regions which are longitudinally aligned, and the both edge portions on an upper part and on a lower part of the channel region include the aperture slits and the light shielding regions which are laterally aligned. If the dimensional accuracy of the photomask pattern in terms of the longitudinal direction is different from the dimensional accuracy in terms of the lateral direction, the thickness of the photo-resist pattern formed inside the channel region is different from the thickness of the photo-resist pattern formed on the both edge portions to be formed on the upper part and the lower part of the channel region. If the thickness of the photo-resist at a center portion of the channel region is different from the thickness of the photo-resist at the both edge portions thereof, expansion amounts of the channel length and a channel width fluctuate due to variation in an exposure amount, and it is therefore difficult to stabilize on-current characteristic of the TFT. For example, when the thickness of the photo-resist at the both edge portions becomes thinner than the thickness of the photo-resist at center portion of the channel region, the exposure amount most suitable for the channel length fluctuates and the on-current of the TFT is thereby reduced. On the contrary, when the thickness of the photo-resist at the both edge portions becomes thicker than the thickness of the photo-resist at center portion of the channel region, the on-current of the TFT is increased but it is necessary to secure a sufficient interval from the channel width to an end of a gate electrode. Accordingly, it is necessary to elongate a gate electrode. When this gate electrode is elongated, the area occupied by the TFT is spread while an aperture ratio is reduced. Therefore, it is preferable to set both dimensional accuracy in the longitudinal direction of the photomask pattern and in the lateral direction thereof to the same degree, and it is necessary to strictly manage the unevenness of the photomask in manufacturing.

In addition, when light is irradiated from a transparent insulating substrate side, an off-current of the TFT, i.e. a light leak current is increased when the light reaches the a-Si layer in the vicinity of the drain electrode without being shielded by the gate electrode. As shown in FIG. 2D, in the TFT formed by use of the photomask of FIG. 2B, each portion of the a-Si layer protruding beyond the drain electrode and located outside of the gate electrode contributes to generation of the leak current. Accordingly, the light leak current is further increased.

Meanwhile, in the mask pattern shown in FIG. 1C, aprotruded portion is formed in a narrow rectangular portion 112c in the vicinity of an end portion of the aperture slit 113c, while a width of the light transparent region is selected equal to or below the resolution ability of the exposure apparatus. However, the influence of the unevenness of the photomask pattern in manufacturing is larger at the protruded portion in the vicinity of the end portion of the aperture slit 113c than in the center portion thereof. Accordingly, a problem similar to the case using the mask pattern shown in FIG. 1B arises.

SUMMARY OF THE INVENTION

Therefore, it is an object of the present invention to provide a thin film transistor capable of stabilizing an on-current and suppressing unevenness in a channel length, a liquid crystal display using this thin film transistor, and a method of manufacturing this thin film transistor.

Moreover, it is another object of the present invention to provide a method of manufacturing a thin film transistor capable of reducing an influence to on-current characteristic of the thin film transistor by using a photomask pattern which can reduce the influence to the on-current characteristic of the thin film transistor.

According to a thin film transistor of the present invention, on both edges of a semiconductor film extending between a source electrode and a drain electrode, there are formed irregularities in a direction orthogonal to the extending direction of the semiconductor film. A concave portion of the irregularities is located outside a region sandwiched by a pair of virtual straight lines linking both ends of opposite edges of the source electrode and the drain electrode.

The thin film transistor of the present invention is characterized in that a width of the semiconductor film is wider than a width of the source electrode and a width of the drain electrode which are located over a gate electrode, and that the semiconductor film at both edge portions in a channel region have an irregular shape including a convex portion and a concave portion.

A liquid crystal display of the present invention includes an active matrix substrate having a thin film transistor formed thereon, and a counter substrate opposed to the active matrix substrate and configured to interpose a liquid crystal layer. Here, the thin film transistor includes a semiconductor film, and a gate electrode located below a channel region with interposing a gate insulating film between the semiconductor film and the gate electrode. The semiconductor film is extending between a source electrode and a drain electrode. Irregularities are formed on both edges of the semiconductor film in a direction orthogonal to the extending direction there of. Moreover, a concave portion of the irregularities of the semiconductor film located outside a region sandwiched by a pair of virtual straight lines linking both ends of opposite edges of the source electrode and the drain electrode. A gate electrode is disposed below a channel region with interposing a gate insulating film between the semiconductor film and the gate electrode.

A method of manufacturing a thin film transistor of the present invention includes the steps of forming a gate electrode on an insulating substrate, forming a semiconductor film and a conductive film on the insulating substrate and on the gate electrode with interposing a gate insulating film between the semiconductor film and the gate electrode, forming a photo-resist film above the semiconductor film and above the conductive film, patterning the conductive film and the semiconductor film by use of the photo-resist film as a mask and thereby forming the conductive film and the semiconductor film in island shapes, forming a source electrode and a drain electrode isolated from each other by patterning the conductive film, and subjecting the semiconductor film between the source electrode and the drain electrode to channel etching. Here, irregularities are formed on both edges of the semiconductor film provided along extending direction thereof, in a direction orthogonal to the extending direction. Moreover, a concave portion of the irregularities is located outside a region sandwiched by a pair of virtual straight lines linking both ends of opposite edges of the source electrode and the drain electrode.

Preferably, the photo-resist film includes thick portions corresponding to thick source and drain electrode formation regions, and a thin portion corresponding to a region between the source electrode formation region and the drain electrode formation region.

Preferably, the photo-resist film is formed by exposure and development while using a photomask including three regions having different amounts of light transmission, and the photomask includes a pair of light shielding regions corresponding to the source electrode formation region and to the drain electrode formation region, a rectangular portion provided between the pair of light shielding regions respectively through slits, the rectangular portion constituting a semi-transparent region together with the slits, and a light transparent region apart from the light shielding regions and the semi-transparent region.

Preferably, the rectangular portion of the photomask is wider than widths of the pair of light shielding regions.

Preferably, a plurality of the rectangular portions of the photomask are provided through the slits.

Preferably, a photomask for forming the photo-resist film includes a pair of light shielding regions corresponding to source and drain formation regions, a light transparent region, and a semi-transparent region having a light transparent and light shielding pattern having dimensions equal to or below resolution ability of an exposure apparatus. Here, the light transparent and light shielding pattern includes a pair of slits and an narrow rectangular portion, and the narrow rectangular portion is longer than widths of opposed portions of the pair of light shielding regions corresponding to the source and drain formation regions.

Preferably, the narrow rectangular portion of the light transparent and light shielding pattern constituting the semi-transparent region of the photomask is longer by 1.5 μm or above than a width of the source formation region and a width of the drain formation region at the opposed portions of the pair of light shielding regions corresponding to the source and drain formation regions.

Preferably, the narrow rectangular portion of the light transparent and light shielding pattern constituting the semi-transparent region of the photomask is longer by a range from 1.5 μm to 3.0 μm inclusive on one side and is longer by a range from 3.0 μm to 6.0 μm inclusive on both sides in total than the width of the source formation region and the width of the drain formation region at the opposed portions of the pair of light shielding regions corresponding to the source and drain formation regions.

In the present invention, the semiconductor film of the thin film transistor extends between the source electrode and the drain electrode. On the both edges of this semiconductor film provided along the extending direction, the irregularities are formed in the direction orthogonal to the extending direction. In addition, the concave portion of the irregularities is located outside the region sandwiched by the pair of virtual straight lines linking the both ends of the opposite edges of the source electrode and the drain electrode. Accordingly, path bending of an on-current of the TFT occurs, whereby it is possible to suppress degradation of picture quality of a liquid crystal display.

Moreover, in the present invention, the photomask for forming the light shielding regions, the light transparent region, and the semi-transparent region includes the pair of light shielding regions corresponding to the source and drain formation regions, the light transparent region, and the semi-transparent region made of the light transparent and light shielding pattern having the dimensions equal to or below the resolution ability of an exposure apparatus. Here, the light transparent and light shielding pattern includes the pair of slit portions and the narrow rectangular portion, or alternatively, the plurality of slit portions and the plurality of narrow rectangular portions, and the one or each of the plurality of narrow rectangular portions is formed longer than the widths of the opposed portions of the pair of light shielding regions corresponding to the source and drain formation regions. In this way, even when the dimensional accuracy in terms of the longitudinal direction is different from the dimensional accuracy in terms of the lateral direction in the photomaskpattern, it is possible to avoid the photo-resist patterns formed on the both edge portions in the channel region from being thinner than the photo-resist pattern for forming the inside of the channel region, and thereby to suppress fluctuation of the amounts of expansion of the channel length and the channel width from the source and drain electrodes due to variation in the amount of exposure light. In this way, it is possible to stabilize the on-current characteristic of the TFT. Therefore, it is possible to relax the dimensional accuracy either in the longitudinal direction or in the lateral direction in the course of manufacturing the photomask, and thereby to suppress reduction in yields. Moreover, uniformity of the thickness of the thin photo-resist pattern for forming the channel region between the source electrode formation region and the drain electrode formation region can be improved. Accordingly, it is possible to solve the problem that display characteristic of a liquid crystal display is degraded due to unevenness in the channel length.

According to the TFT and the, liquid crystal display applying the TFT of the present invention, there are effects to stabilize the on-current of the TFT and to suppress unevenness in the channel length. Moreover, according to the method of manufacturing a TFT of the present invention, there is an effect to reduce the influence of the unevenness of the photomask pattern caused in manufacturing to the on-current characteristic of the TFT.

BRIEF DESCRIPTION OF THE DRAWINGS

These and other objects and advantages and further description of the invention will be more apparent to those skilled in the art by reference to the description, taken in connection with the accompanying drawings, in which:

FIG. 3B is a cross-sectional view taken along the I-I line in FIG. 3A.

FIG. 6A is a characteristic chart showing a relation between a rectangular protruding length of the photomask shown in FIG. 5, and, a distance between a channel edge and a source-drain edge, while

DETAILED DESCRIPTION OF THE PREFERRED EMBODIMENTS

Now, preferred embodiments of the present invention will be described with reference to the accompanying drawings. A first embodiment will be described with reference to FIG. 3A to FIG. 7 and a second embodiment will be described with reference to FIG. 8A to FIG. 8C. Either embodiment is intended to define a width of a semiconductor film located over a gate electrode, which constitutes a channel region between a source electrode and a drain electrode in a thin film transistor. In particular, the semiconductor film extends between the source electrode and the drain electrode, and on both edges of this semiconductor film provided along extending direction, and there are formed irregularities in a direction orthogonal to the extending direction. Here, a concave portion of the irregularities is located outside a region sandwiched by a pair of virtual straight lines linking both ends of opposite edges of the source electrode and the drain electrode.

Figure 3A:
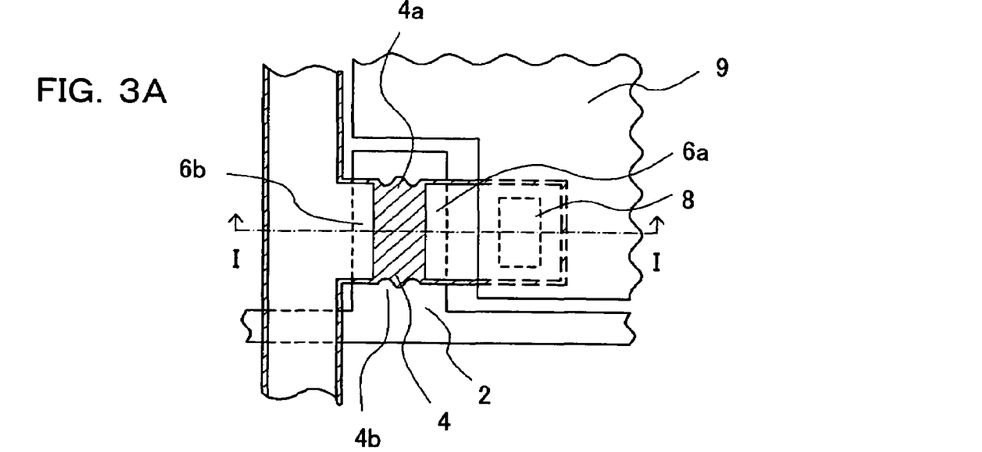
FIG. 3A is a plan view showing a unit pixel on an active matrix substrate using a thin film transistor according to a first embodiment of the present invention.

First of all, the first embodiment will be described with reference to the drawings. As shown in FIG. 3A, a thin film transistor of this embodiment is intended to define a width of a semiconductor film 4 located over a gate electrode 2, which constitutes a channel region between a source electrode 6a and a drain electrode 6b. Specifically, the semiconductor film 4 extends between the source electrode 6a and the drain electrode 6b, and on both edges of this semiconductor film 4 provided along the extending direction, irregularities (a concave portion 4b and a convex portion 4a) are formed in a direction orthogonal to the extending direction. Here, as shown in FIG. 3C, a pair of virtual straight lines 30 linking both ends of opposed edges of the source electrode 6a and the drain electrode 6b will be assumed. The concave portion 4b of the irregularities is located outside a region sandwiched by this pair of virtual straight lines 30. In other words, width of this semiconductor film 4 located over the gate electrode 2 is wider than that of the source electrode 6a and that of the drain electrode 6b, and the semiconductor film 4 at each of both edge portions of a channel region have an irregular shape including the convex portion 4a and the concave portion 4b.

When the TFTs having the above-described shape are used in a liquid crystal display, the TFTs are arranged in a matrix on an active matrix substrate and the source electrodes 6a are electrically connected to pixel electrodes 9 through contact holes 8.

Figure 3B:
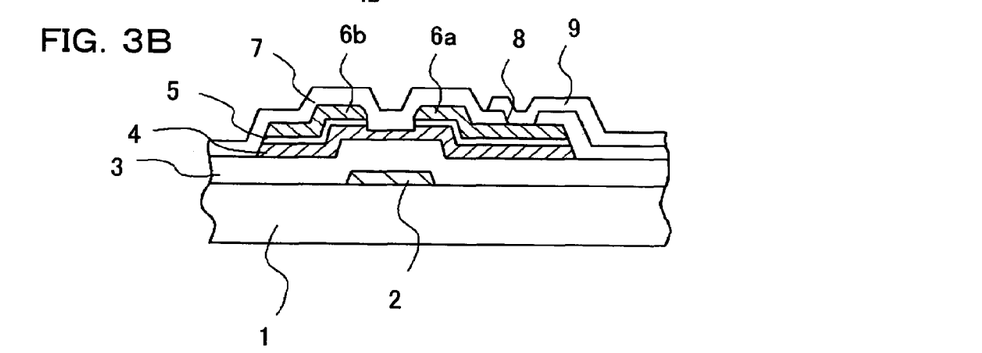
Figure 3C:
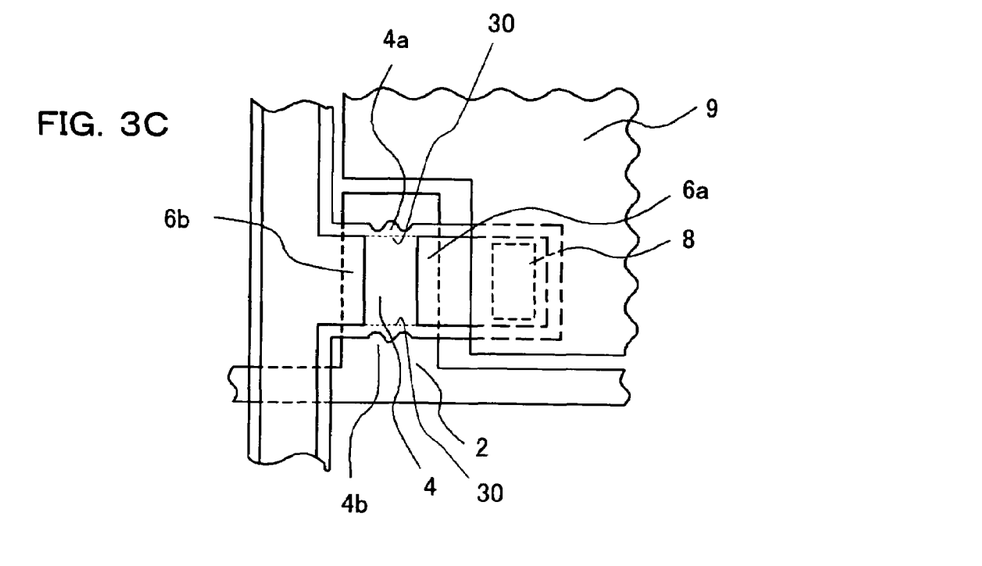
FIG. 3C is another plan view of the unit pixel for explaining a pair of virtual straight lines linking both ends of opposed edges of source and drain electrodes.

Referring to FIG. 3B, the gate electrode made of a metal layer or the like is formed on a transparent insulating substrate 1. The semiconductor film 4 where the channel region is to be provided is formed on this gate electrode 2 with interposing a gate insulating film 3 between the semiconductor film 4 and the gate electrode 2. Moreover, the source electrode 6a and the drain electrode 6b made of a metal layer or the like are formed on both sides of this semiconductor film 4 with interposing a highly impurity doped semiconductor film 5 between the semiconductor film 4 and the source and drain electrodes 6a, 6b. In addition, a passivation film 7 is formed to cover these constituents, and the pixel electrode 9 is formed so as to be electrically connected to the source electrode 6a through the contact hole 8 opened at the passivation film 7. Although the source and drain of the TFT are determined depending on operating potential applying to gate, source and drain, the electrode connected to the pixel electrode will be referred to as the source electrode in this specification.

Figure 4A:
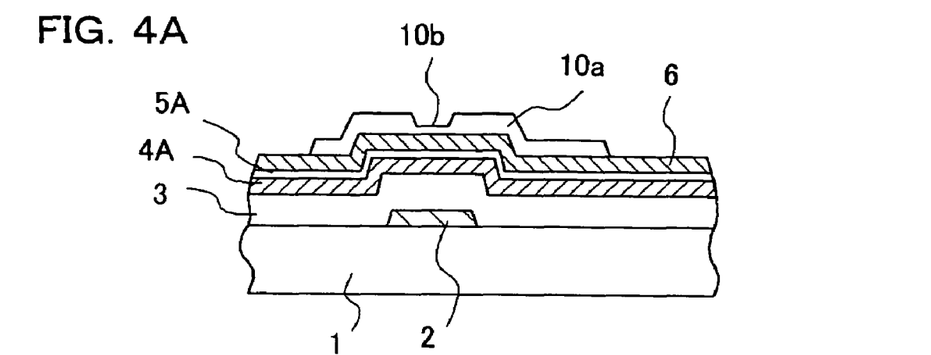
FIG. 4A to FIG. 4D are cross-sectional views showing the order of manufacturing steps along the I-I line in FIG. 3A.

Next, a method of manufacturing the TFT having planar layout as shown in FIG. 3A and the cross-sectional structure as shown in FIG. 3B will be described with reference to FIG. 4A to FIG. 5.

Firstly, on the transparent insulating substrate 1 such as glass, a metal layer such as Mo, Cr, Ta, or lamination of Mo on Al, or an alloy laminated film containing the foregoing metal as a main component, or the like is formed in a thickness in the range from 200 nm to 300 nm by use of the sputtering method or the like. Further, this metal layer is formed into the gate electrode 2 by use of the photo-lithographic technique and the etching technique.

Next, the gate insulating film 3 made of a SiN film or a laminated film of a $SiO_2$ film and a SiN film is formed in a thickness from 350 nm to 500 nm by the plasma-enhanced CVD method, then an a-Si layer 4A as a semiconductor film is formed in a thickness in the range from 100 nm to 250 nm, and then an $n^+$ a-Si layer 5 as a highly impurity doped semiconductor film doped with phosphorus (P) is formed in a thickness from 20 nm to 50 nm, in order. Next, Mo, Cr, Ta, or a laminated film of Mo, Al, and Mo is formed as a metal layer 6 for source and drain electrodes in a thickness from 200 nm to 300 nm by use of the sputtering method or the like. Thereafter, a positive photo-resist is coated on the insulating substrate 1 in a thickness from 1 μm to 2 μm.

Figure 5:
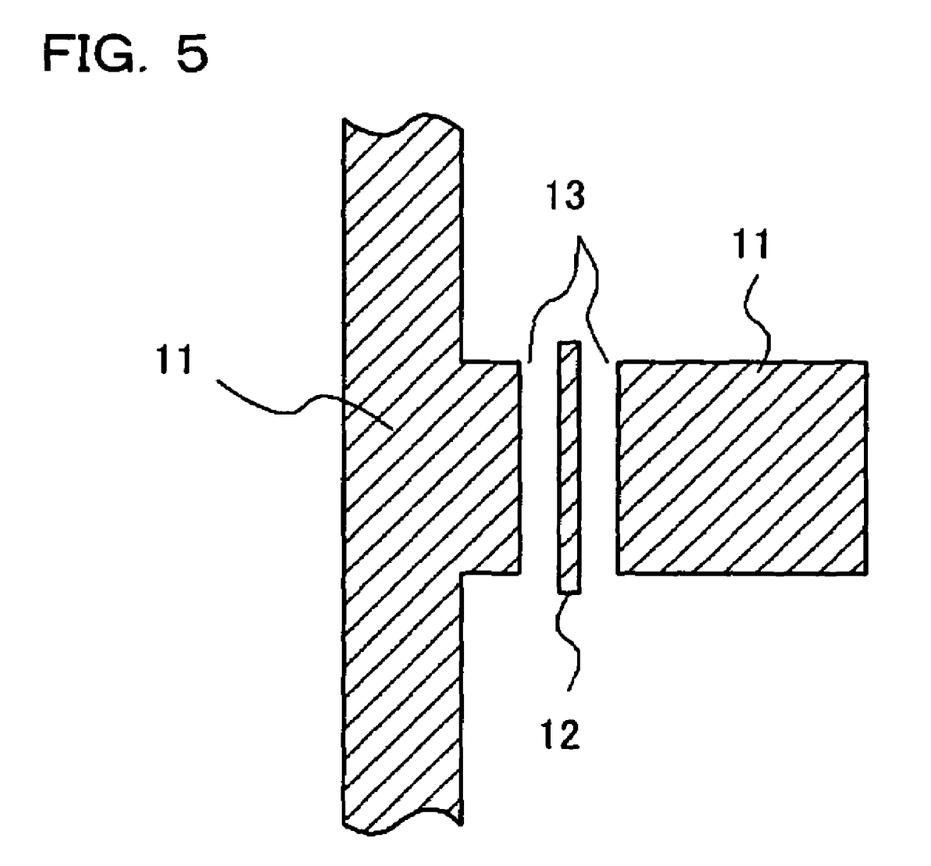
FIG. 5 is a plan view of a photomask pattern used for manufacturing the thin film transistor according to the first embodiment of the present invention.

Next, the photo-resist is exposed and developed by use of a photomask pattern as shown in FIG. 5. Specifically, the photomask pattern shown in FIG. 5 is a halftone mask including three regions having mutually different amounts of light transmission, that is, a light shielding region, a semi-transparent region, and a light transparent region. The light shielding region includes a pair of light shielding regions 11 for forming source and drain regions. The semi-transparent region includes slits 13, and one narrow rectangular portion 12 disposed between the pair of light shielding regions 11 through the slits 13 and having a width greater than that of the pair of light shielding regions 11. That is, the width of the narrow rectangular portion 12 along gate width direction of TFT is greater than that of light shielding regions 11. In this embodiment, the single narrow rectangular portion 12 is disposed between the pair of light shielding regions 11. Moreover, the region other than the light shielding portions and the semi-transparent portion serves as the light transparent region. The exposure and development will be performed by use of the photomask pattern thus configured. In this case, amount of exposure light is controlled so as to remove photo-resist film located in the light transparent region, to remain photo-resist film located in the light shielding regions 11 keeping thickness of the photo-resist film substantially same as when coated, and to remain thin photo-resist film in the semi-transparent region, which includes the narrow rectangular portion 12 and the slits 13 having dimension equal to or below resolution ability of an exposure apparatus. The thickness of the photo-resist film located in the semi-transparent region is reduced to become from 20% to 60% as thick as the photo-resist film in the light shielding regions 11, or into the thickness of from approximately 200 nm to 600 nm, for example. In this way, the photo-resist film including thick source and drain formation portions 10a and a thin channel formation portion 10b are formed as shown in FIG. 4A.

Next, the source and drain metal layer 6 is patterned by dry etching or wet etching while using the remaining photo-resist film as a mask. For example, wet etching with a $CeNHO_3$ etchant is applied when the source and drain metal layer 6 is made of Cr, and dry etching with mixture gas either $SF_6$ or $CF_4$ with $O_2$ is applied when the source and drain metal layer 6 is made of Mo. Thereafter, exposed portions of the highly impurity doped semiconductor film 5 (5A) made of $n^+$ a-Si and of the semiconductor film 4 (4A) made of a-Si by use of dry etching with mixture gas $SF_6$ with either HCl or $O_2$. In this way, the shaded portion in FIG. 3A, and portions of the highly impurity doped semiconductor film 5 (5A) made of $n^+$ a-Si and of the semiconductor film 4 (4A) made of a-Si to be covered with the source electrode 6a, the drain electrode 6b, and a drain bus line are retained. The retained pattern has island shapes at portions corresponding to respective unit pixels but is formed integrally with the single drain bus line.

Figure 4B:
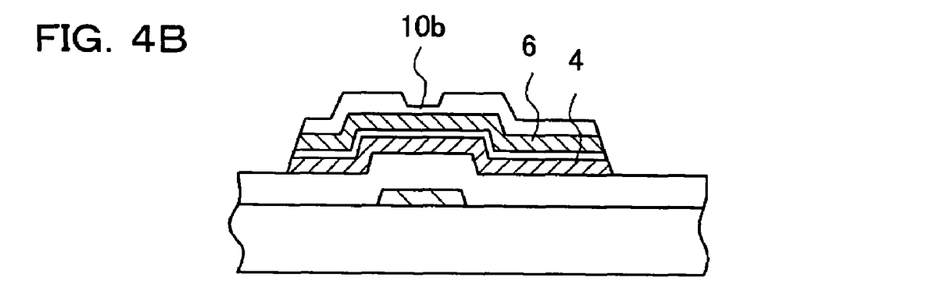
Figure 4C:
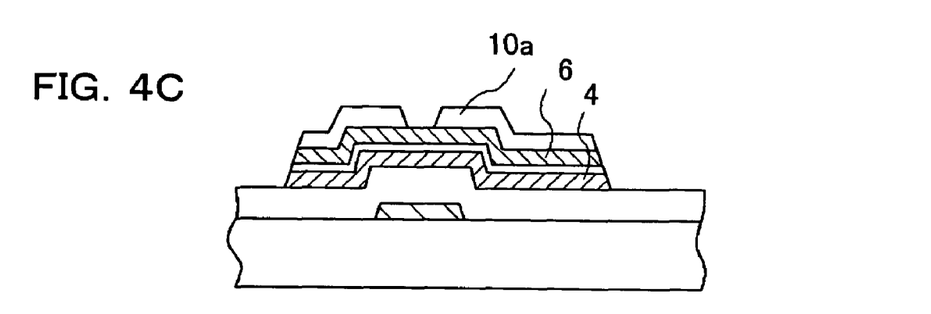

Here, as shown in FIG. 4C, the photo-resist film including the thick source and drain formation portion 10a and the thin channel formation portion 10b is also etched. For the entire photo-resist film, the thin channel formation portion 10b is removed and the thick source and drain formation region 10a is retained. Primary etching of the source and drain metal layer 6, the $n^+$ a-Si layer 5, and a-Si layer 4 is performed by use of the photo-resist film thus retained. Alternatively, the portions of the highly impurity doped semiconductor film 5 made of $n^+$ a-Si and of the semiconductor film 4 made of the a-Si layer are removed by use of dry etching with mixture gas either $SF_6$ or $CF_4$ with either HCl or $O_2$. When the thin channel formation portion 10b as shown in FIG. 4B remains, the thin channel formation portion 10b of the photo-resist film is removed by dry ashing using $O_2$ gas, while the source and drain formation portion 10a is retained as shown in FIG. 4C. In response to a planar layout of the photo-resist film, the highly impurity doped semiconductor film 5 made of $n^+$ a-Si and the semiconductor film 4 made of a-Si are formed into an irregular shape above the gate electrode 2, which includes the convex portion 4a and the concave portion 4b.

Figure 4D:
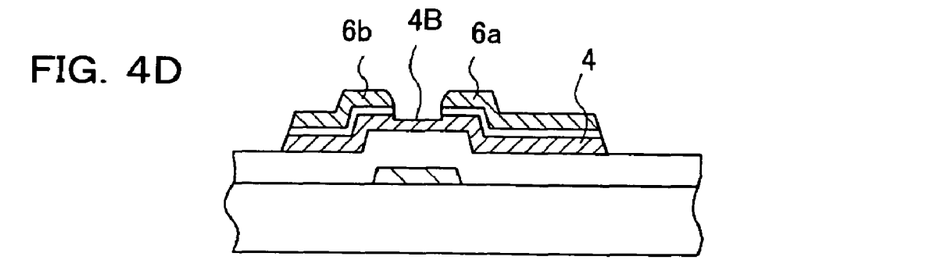

Next, as shown in FIG. 4D, secondary etching for the source and drain metal layer 6 and the $n^+$ a-Si layer 5A located between the pair of photo-resist films 10a is performed by etching similar to the primary etching for the source and drain metal layer 6 and the $n^+$ a-Si layer 5A. When etching the $n^+$ a-Si layer 5A, part of a surface of the a-Si layer 4A is etched so as to retain a certain thickness, such as a thickness in a range from 50% to 80% at the time of film formation is retained to form a channel region 4B. Subsequently, the TFT shown in FIG. 4D is formed by removing the photo-resist film. Here, this photo-resist film is removed after the secondary etching of the source and drain metal layer 6. Alternatively, it is also possible to form the channel region 4B by etching the $n^+$ a-Si layer 5A using the source and drain metal layer 6 as a mask, after removing the photo-resist film.

Next, the passivation film 7 made of SiN is formed in a thickness from 300 nm to 400 nm by the plasma-enhanced CVD method, and then the contact hole 8 is opened by use of the photo-lithographic technique and the etching technique. Although it is not illustrated herein, a contact hole for connection to a gate wiring is formed on the gate insulating film 3 and on the passivation film 7, and a contact hole for connection to a drain wiring is opened at the passivation film 7. Moreover, an ITO film is formed on the passivation film 7 in a thickness from 40 nm to 140 nm by the sputtering method, and then the pixel electrode 9 connected to the source electrode 6a is formed by use of the photo-lithographic technique and the etching technique. In this way, it is possible to manufacture the active matrix substrate using the thin film transistor shown in FIG. 3A and FIG. 3B.

Figure 6A:
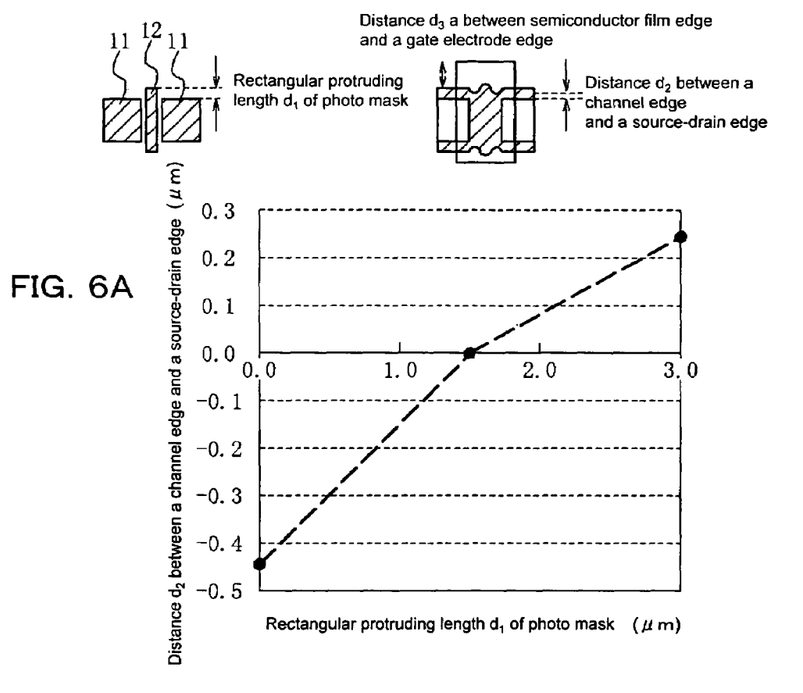

Next, relation between a protruding length d1 of the narrow rectangular portion 12 of the photomask pattern and a channel edge—source and drain distance d2 will be described with reference to FIG. 6A. An amount of protrusion of the narrow rectangular portion 12 from the light shielding region 11 of the photo mask pattern shown in FIG. 5 will be defined as a photo mask rectangular protruding length d1. In addition, distance between edge of the source and drain electrodes 6a and 6b manufactured by exposure and development using the photomask pattern having the rectangular protruding length d1, and, an edge of the concave portion 4b of the semiconductor film 4 in the channel region will be defined as distance d2 between a channel edge and source-drain edge. That is, FIG. 6A shows variation of the distance d2 when changing the length d1 of the narrow rectangular portion 12 for forming the semi-transparent region. According to FIG. 6A, when the protruding length d1 exceeds 1.5 µm, it is apparent that the distance d2 turns into positive, i.e. that the concave portion 4b of the semiconductor region 4 in the channel region becomes wider than the edges of the source and drain electrodes 6a and 6b.

Figure 6B:
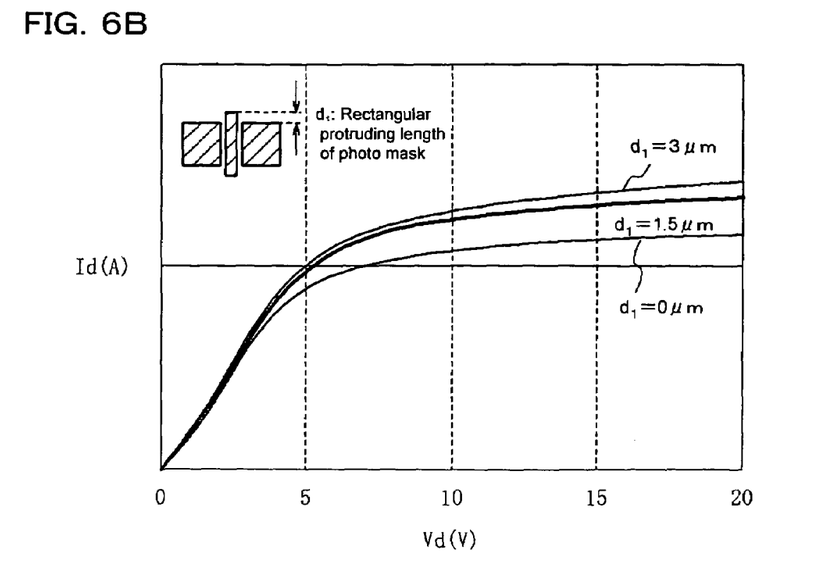
FIG. 6B is a characteristic chart showing a relation between the rectangular protruding length of the photomask shown in FIG. 5 and drain current—drain voltage of a TFT.

FIG. 6B shows a drain current Id—drain voltage Vd characteristic of the TFT when changing the protruding length d1 to 0 µm, 1.55 µm, and 3.0 µm, respectively. Here, a gate voltage is set to 10 V. From FIG. 6A and FIG. 6B, it is apparent that the irregularities 4b and 4b are formed on the both edge portions in the channel region when the photomask rectangular protruding length d1 is set equal to or above 1.5 µm, and that an influence to an on-current of the TFT can be suppressed even when the both edge portions are flexed.

Here, distance between an edge of the semiconductor film 4 in the channel region and an edge of the gate electrode 2 will be defined as a gate electrode protruding length d3 as shown in FIG. 6A. When light is irradiated from the transparent insulating substrate 1 side, an off-current of the TFT, i.e. a light leak current is increased if the light is not shielded by the gate electrode 2 and reaches the a-Si layer 4. To suppress the increase in the off-current, the gate electrode protruding length d3 cannot be set shorter than a predetermined length. Accordingly, the area of the pixel electrode is decreased and an aperture ratio is thereby reduced. When the rectangular protruding length d1 is increased, it is not possible to reduce the gate electrode protruding length d3 at the same time. However, this problem is not incurred when the rectangular protruding length d1 equal to or below 3.0 µm. To sum up, the narrow rectangular portion 12 in the semi-transparent region of the photomask is set longer by a range from 1.5 µm to 3.0 µm inclusive on one side and longer by a range from 3.0 µm to 6.0 μm inclusive on both sides in total than the width of the source and drain formation regions at the opposed portions of the pair of light shielding regions 11 corresponding to the source and drain formation regions.

Figure 7:
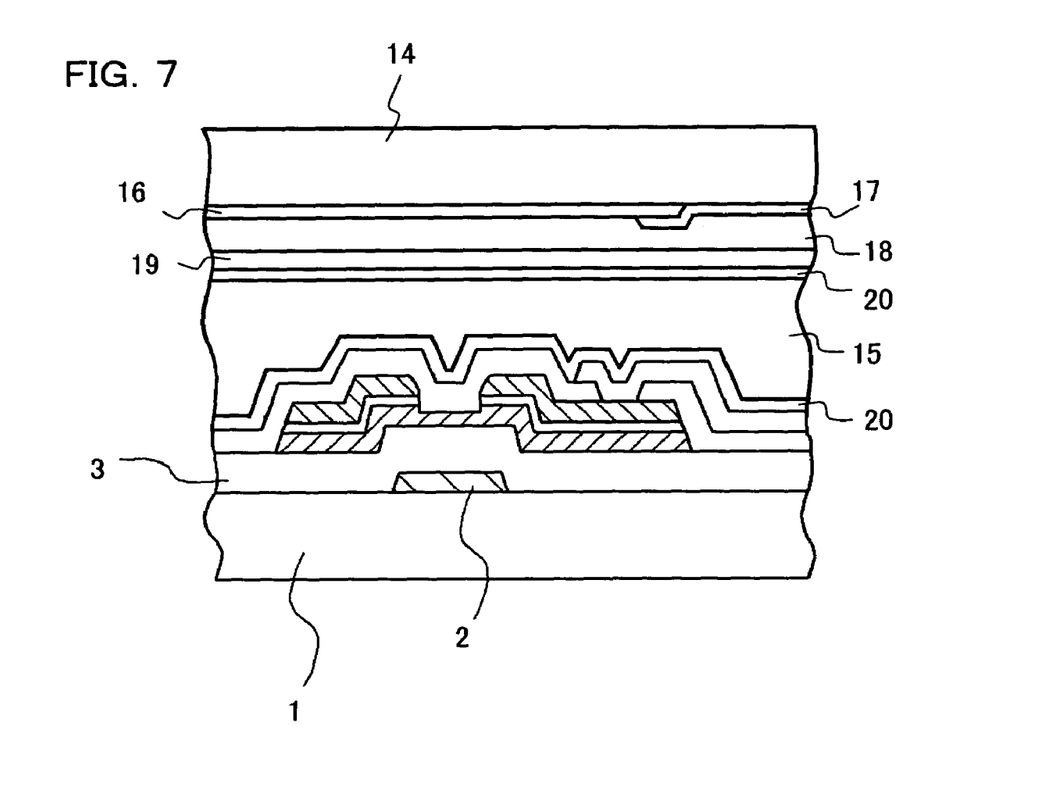
FIG. 7 is across-sectional view of a liquid crystal display using the active matrix substrate shown in FIG. 3A and FIG. 3B.

Next, a liquid crystal display using the above-described thin film transistor will be briefly described. Referring to FIG. 7, this liquid crystal display interposes a liquid crystal layer 15 between the active matrix substrate where the above-described TFTs of the first embodiment are formed thereon, and, a counter substrate including a light shielding film 16 formed on a transparent insulating substrate 14, a color filter layer 17, a planarization film 18 for planarizing surfaces of the light shielding film 16 and of the color filter film 17, and a counter electrode 19 formed on the planarization film 18. Alignment films 20 are respectively formed on surfaces of the active matrix substrate and the counter substrate which contact the liquid crystal layer 15.

As described above, in the thin film transistor of this embodiment, the semiconductor film 4 extends between the source electrode 6a and the drain electrode 6b. On the both edges of this semiconductor film 4 along the extending direction, there are formed the irregularities (the concave portion 4b and the convex portion 4b) in the direction orthogonal to the extending direction. Moreover, the concave portion 4b of the irregularities is located outside the region sandwiched by the pair of virtual straight lines 30 linking the both ends of the opposite edges of the source electrode 6a and the drain electrode 6b. Accordingly, it is possible to stabilize the on-current and to realize suppression of unevenness in the channel length.

Moreover, in the liquid crystal display of this embodiment, the semiconductor film 4 of the thin film transistor extends between the source electrode 6a and the drain electrode 6b. On the both edges of this semiconductor film 4 along the extending direction, there are formed the irregularities (the concave portion 4b and the convex portion 4a) in the direction orthogonal to the extending direction. Moreover, the concave portion 4b of the irregularities is located outside the region sandwiched by the pair of virtual straight lines 30 linking the both ends of the opposite edges of the source electrode 6a and the drain electrode 6b. Accordingly, it is possible to stabilize the on-current of the thin film transistor and to realize suppression of unevenness in the channel length. In this way, degradation of a display characteristic can be prevented.

Furthermore, the irregularities 4a and 4b are formed on the both edge portions in the channel region by use of the photomask pattern including the rectangular protruding length d1 designed in the range from 1.5 μm to 3.0 μm, and it is possible to suppress the influence to the on-current of the TFT even if the both edge portions are flexed. In addition, it is possible to prevent reduction in the aperture ratio while suppressing the increase in the light leak current.

Figure 8A:
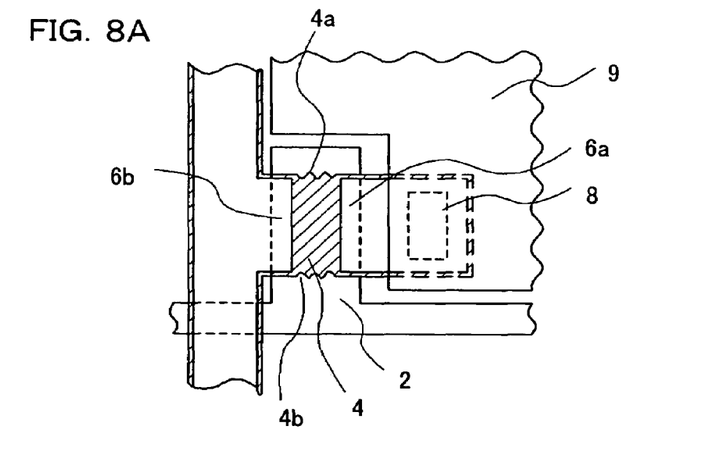
FIG. 8A is a plan view showing a unit pixel on an active matrix substrate using a thin film transistor according to a second embodiment of the present invention.
Figure 8B:
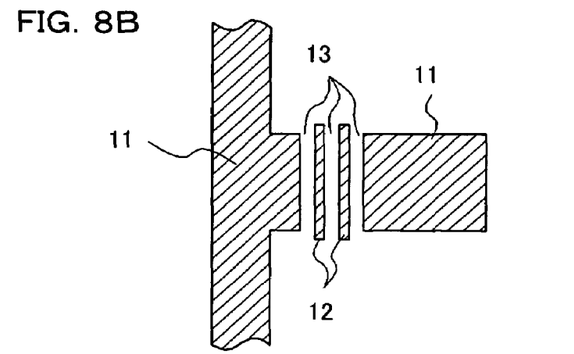
FIG. 8B is a plan view of a photomask pattern used for manufacturing the thin film transistor according to the second embodiment of the present invention.
Figure 8C:
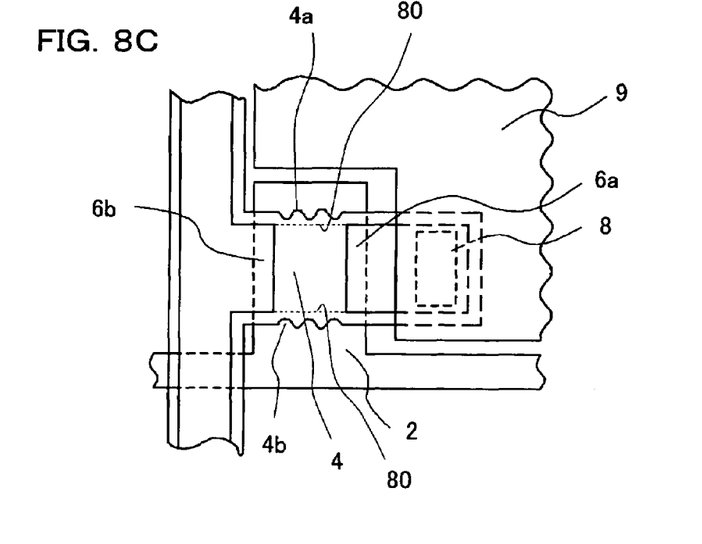
FIG. 8C is another plan view of the unit pixel for explaining a pair of virtual straight lines linking both ends of opposed edges of source and drain electrodes.

Next, a second embodiment of the present invention will be described. A thin film transistor of this embodiment is also intended to define the width of the semiconductor 4 located over the gate electrode 2, which constitutes the channel region between the source electrode 6a and the drain electrode 6b. Specifically, the semiconductor film 4 extends between the source electrode 6a and the drain electrode 6b, and on both edges of this semiconductor film 4 provided a long the extending direction, the irregularities (the concave portion 4b and the convexportion 4a) are formed in the direction orthogonal to the extending direction. Here, as shown in FIG. 8C, a pair of virtual straight lines 80 linking both ends of opposed edges of the source electrode 6a and the drain electrode 6b will be assumed. The concave portion 4b of the irregularities is located outside a region sandwiched by this pair of virtual straight lines 80. In other words, the width of this semiconductor film 4 is wider than the width of the source electrode 6a and the width of the drain electrode 6b located over the gate electrode 2, and the semiconductor film 4 at each of both edge portions of the channel region have the irregular shape including the convex portions 4a and the concave portions 4b. In this embodiment, as shown in FIG. 8A, each of the both edge portions of the semiconductor film 4 in the channel region have an irregular shape including two convex portion 4a and three concave portions 4b. That is, a plurality of convex portions 4a and a plurality of concave portions 4b are respectively formed in each of the both edge portions of the semiconductor film 4.

When manufacturing this TFT, a halftone mask including the light shielding regions, the semi-transparent region, and the light transparent region is used as similar to the above-described manufacturing method of the first embodiment. However, the pattern of the photomask used herein is different from the pattern of the first embodiment. In this embodiment, the light shielding regions includes a pair of light shielding regions 11. The semi-transparent region includes the slits 13, and the narrow rectangular portions 12 disposed between the pair of light shielding regions 11 through the slits 13 and having the width greater than the widths of the light shielding regions 11. Specifically, in this embodiment, two narrow rectangular portions 12 and three slits 13 are disposed between the pair of light shielding regions 11. The region other than the light shielding regions and the semi-transparent region serves as the light transparent region. The TFT is formed by performing exposure and development using the photomask pattern, which includes the semi-transparent region having the two narrow rectangular portions 12 longer than the widths of the opposed portions of the light shielding regions 11.

In a liquid crystal display of this embodiment, the semiconductor film 4 extends between the source electrode 6a and the drain electrode 6b. On the both edges of this semiconductor film 4 along the extending direction, there are formed the irregularities (the concave portion 4b and the convex portion 4a) in the direction orthogonal to the extending direction. Moreover, the concave portion 4b of the irregularities is located outside the region sandwiched by the pair of virtual straight lines 80 linking the both ends of the opposite edges of the source electrode 6a and the drain electrode 6b. Accordingly, it is possible to stabilize the on-current of the thin film transistor and to realize suppression of unevenness in the channel length. In this way, degradation of a display characteristic can be prevented.

Moreover, in this embodiment, it is possible to suppress variation in the film thickness of the photo-resist film for forming the thin channel region between the source and drain formation regions in response to variation in the exposure amount during this exposure and development process. Accordingly, this embodiment has an advantage that it is possible to further suppress unevenness in the channel length as compared to the first embodiment.

Furthermore, as similar to the first embodiment, the irregularities 4a and 4b are formed on the both edge portions in the channel region by use of the photomask pattern including the photomask rectangular protruding length d1 designed in the range from 1.5 μm to 3.0 μm, and it is possible to suppress the influence to the on-current of the TFT even if the both edge portions are flexed. In addition, it is possible to prevent reduction in the aperture ratio while suppressing the increase in the light leak current.

Although the preferred embodiments of the invention have been described with reference to the drawings, it will be obvious to those skilled in the art that various changes or modifications maybe made without departing form the true scope of the invention.

What is claimed is:

1. A method of manufacturing a thin film transistor comprising the steps of:
    forming a gate electrode on an insulating substrate;
    forming a semiconductor film and a conductive film on said insulating substrate and on said gate electrode with interposing a gate insulating film between both said insulating substrate and said gate electrode, and said semiconductor film;
    forming a photo-resist film above said semiconductor film and above said conductive film;
    patterning said conductive film and said semiconductor film by use of said photo-resist film as a mask and thereby forming a conductive film and a semiconductor film in island shapes;
    forming a source electrode and a drain electrode isolated from each other by patterning said conductive film; and
    subjecting said semiconductor film between said source electrode and said drain electrode to channel etching,
    wherein irregularities are formed on both edges of said semiconductor film provided
    along extending direction and in a direction orthogonal to the extending direction, and
    a concave portion of the irregularities is located outside a region sandwiched by a pair of virtual straight lines linking both ends of opposite edges of said source electrode and said drain electrode.

2. The method of manufacturing a thin film transistor according to claim 1,
    wherein said photo-resist film comprises:
    thick portions corresponding to a source electrode formation region and a drain electrode formation region; and
    a thin portion corresponding to a channel formation region between said source electrode formation region and said drain electrode formation region, having a thickness thinner than that of said thick portions.

3. The method of manufacturing a thin film transistor according to claim 1,
    wherein said photo-resist film is formed by exposure and development while using a photomask including three regions having different amounts of light transmission, and
    said photomask comprises a pair of light shielding regions corresponding to said source electrode formation region and to said drain electrode formation region, a rectangular portion provided between said pair of light shielding regions respectively through slits, said rectangular portion constituting a semi-transparent region together with said slits, and a light transparent region apart from said light shielding regions and said semi-transparent region.

4. The method of manufacturing a thin film transistor according to claim 3,
    wherein said rectangular portion of said photomask is wider than widths of said pair of light shielding regions.

5. The method of manufacturing a thin film transistor according to claim 4,
    wherein a plurality of rectangular portions are provided through said slits, each rectangular portion being same as said rectangular portion of said photomask.

6. The method of manufacturing a thin film transistor according to claim 2,
    wherein a photomask for forming said photo-resist film comprises a pair of light shielding regions corresponding to source and drain formation regions, a light transparent region, and a semi-transparent region having a light transparent and light shielding pattern having dimensions equal to or below resolution ability of an exposure apparatus,
    said light transparent and light shielding pattern includes a pair of slits and an narrow rectangular portion, and
    said narrow rectangular portion is longer than widths of opposed portions of said pair of light shielding regions corresponding to said source and drain formation regions.

7. The method of manufacturing a thin film transistor according to claim 6,
    wherein said narrow rectangular portion of said light transparent and light shielding pattern constituting said semi-transparent region of said photomask is longer by 1.5 μm or more than any of a width of said source formation region and a width of said drain formation region at the opposed portions of said pair of light shielding regions corresponding to said source and drain formation regions.

8. The method of manufacturing a thin film transistor according to claim 6,
    wherein said narrow rectangular portion of said light transparent and light shielding pattern constituting said semi-transparent region of said photomask is longer in a range from 1.5 μm to 3.0 μm inclusive on one side and is longer in a range from 3.0 μm to 6.0 μm inclusive on both sides in total than any of the width of said source formation region and the width of said drain formation region at the opposed portions of said pair of light shielding regions corresponding to said source and drain formation regions.

9. The method of manufacturing a thin film transistor according to claim 4,
    wherein said rectangular portion of said photomask is longer in a range from 1.5 μm to 3.0 μm inclusive on one side and is longer in a range from 3.0 μm to 6.0 μm inclusive on both sides in total than any of the width of said source formation region and the width of said drain formation region at the opposed portions of said pair of light shielding regions corresponding to said source and drain formation regions.

* * * * *